United States Patent [19]
Nakamura

[11] Patent Number: 4,939,579
[45] Date of Patent: Jul. 3, 1990

[54] SOLID-STATE IMAGE PICK-UP DEVICE INCLUDING STATIC INDUCTION TRANSISTORS WITH PHOTOMETRIC FUNCTION

[75] Inventor: Junichi Nakamura, Ina, Japan

[73] Assignee: Olympus Optical Co., Ltd., Tokyo, Japan

[21] Appl. No.: 227,369

[22] Filed: Aug. 2, 1988

[30] Foreign Application Priority Data

Aug. 8, 1987 [JP] Japan .................. 62-198717

[51] Int. Cl.[5] .............................. H04N 3/14
[52] U.S. Cl. ..................... 358/213.12; 358/213.19
[58] Field of Search ............. 358/213.12, 213.19; 357/24 LR, 30 G, 30 H

[56] References Cited

U.S. PATENT DOCUMENTS

| | | | |
|---|---|---|---|
| 4,518,863 | 5/1985 | Fukuoka | 250/578 |
| 4,524,391 | 6/1985 | Nishizawa et al. | 358/213.12 |
| 4,531,156 | 7/1985 | Nishizawa | 358/213 |
| 4,549,131 | 10/1985 | Kusazaki | 357/45 |
| 4,556,909 | 12/1985 | Yamada | 358/212 |
| 4,573,077 | 2/1986 | Imai | 358/212 |
| 4,574,309 | 3/1986 | Arisawa | 358/212 |
| 4,587,562 | 5/1986 | Imai | 358/212 |
| 4,589,003 | 5/1986 | Yamada | 357/22 |
| 4,589,027 | 5/1986 | Nakamura | 358/213 |
| 4,603,355 | 7/1986 | Yamada | 358/213 |
| 4,611,221 | 9/1986 | Imai et al. | 357/30 |
| 4,616,249 | 10/1986 | Nishizawa | 357/30 |
| 4,626,916 | 12/1986 | Mizoguchi et al. | 358/213 |
| 4,636,865 | 1/1987 | Imai | 358/213 |
| 4,644,402 | 2/1987 | Yamada | 358/213 |
| 4,677,453 | 6/1987 | Matsumoto | 357/30 |
| 4,678,938 | 7/1987 | Nakamura | 307/311 |
| 4,684,968 | 8/1987 | Ohta | 358/30 |
| 4,684,992 | 8/1987 | Nakamura | 358/213.12 |
| 4,686,555 | 8/1987 | Yusa | 357/30 |
| 4,717,945 | 1/1988 | Yusa | 357/24 |
| 4,746,984 | 5/1988 | Matsumoto | 358/213.12 |

FOREIGN PATENT DOCUMENTS

| | | |
|---|---|---|
| 15131 | 2/1978 | Japan . |
| 64711 | 4/1982 | Japan . |
| 113468 | 5/1987 | Japan . |
| 33075 | 2/1988 | Japan . |
| 131662 | 6/1988 | Japan . |

Primary Examiner—Stephen Brinich
Attorney, Agent, or Firm—Frishauf, Holtz, Goodman & Woodward

[57] ABSTRACT

A solid-state image pickup device comprises a pixel array having static induction transistors disposed in a line for constituting pixels and integrating charges corresponding to amounts of received light, a readout circuit for scanning the static induction transistors to read out a pixel signal representing the amount of charges integrated in each of the transistors, and a photometric circuit coupled to sources of the static induction transistors for controlling the integral times thereof. The photometric circuit has a plurality of MOS transistors having their gates connected to the sources of the static induction transistors, and a source follower having a load resistor connected to sources of the MOS transistors.

1 Claim, 10 Drawing Sheets

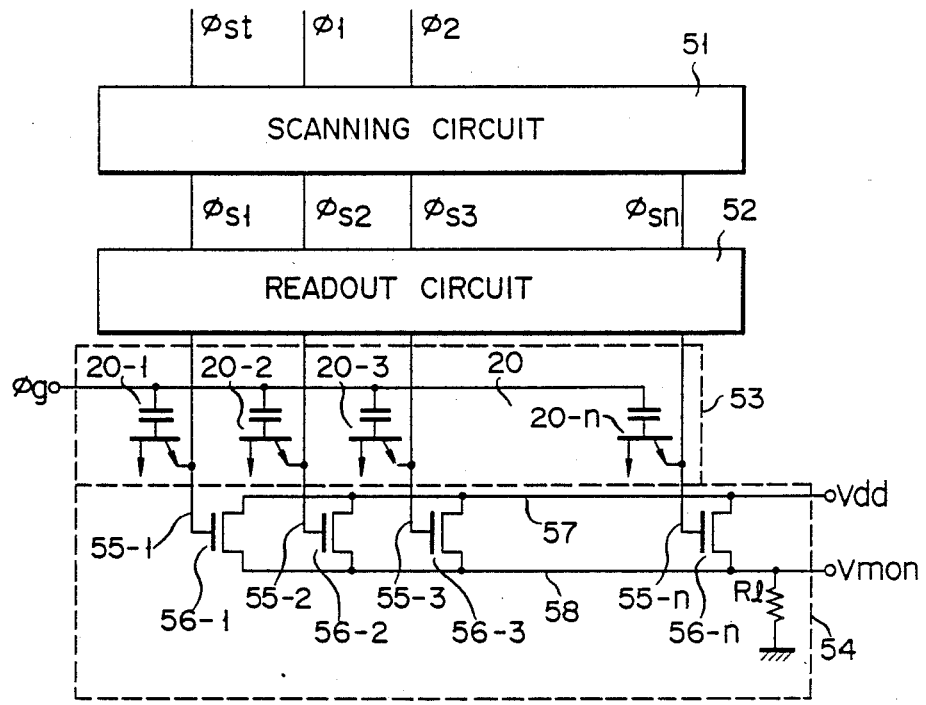
F I G. 13

SOLID-STATE IMAGE PICK-UP DEVICE INCLUDING STATIC INDUCTION TRANSISTORS WITH PHOTOMETRIC FUNCTION

BACKGROUND OF THE INVENTION

1. Field of the Invention

The present invention relates to a solid-state image pickup device and, more particularly, to the control of an integral time of charges in the line sensor.

2. Description of the Related Art

Conventionally, electronic still cameras, video cameras, facsimiles and the like use a solid-state image pickup device composed of semiconductor photoelectric conversion elements. For example, charge-transfer elements such as CCD or BBD or MOS transistors are disposed in a matrix form or in a line to implement an image pickup device or an in-focus detecting sensor. The problems with those devices are the leakage of charges at a time of transfer of signal charges and low light-detecting sensitivity.

To solve these problems a solid-state image pickup device has been developed which uses static induction transistors (hereinafter referred to as SITs). The SITs are one type of phototransistors which have functions of photoelectric conversion and amplification. In contrast with field effect transistors and junction transistors, the SITs have features of high input impedance, high-speed operation, nonsaturation characteristic, low noise and low power dissipation. Accordingly, by using the SITs as light-receiving elements it will be possible to implement a solid-state image pickup device of great sensitivity, high-speed response and wide dynamic range.

A conventional application of a solid-state image pickup device using the SITs to a line sensor will be described. There is a method in which, when the level of light amount of the image of an object is small, an integral time is increased, while, when the level of light amount is large, the integral time is decreased, in order to keep an output level approximately constant independently of the level of light amount and thus extend the dynamic range for light amount. As an example, an automatic focus detecting device is disclosed in a Japanese laid-open Patent publication No. 57-64711 in which a photodiode (hereinafter referred to as photometric photodiode) adapted for controlling the integral time is provided adjacent to a CCD or MOS line sensor.

FIG. 1 shows a simplified circuit diagram of the device, and FIG. 2 shows a waveform diagram of signals associated with the device.

A photometric photodiode 2 is disposed adjacent to a photodiode array 1 having photodiodes arranged in a line. Photometric photodiode 2 has a length equal to the length of photodiode array 1. Output of photometric photodiode 2 is taken out through an output buffer 3. Outputs of photodiode array 1 are in parallel applied to a CCD shift register 5 via transfer gates 4 and then transferred through shift register 5 to be serially taken out via an output buffer 6. This arrangement forms a CCD line sensor.

The operation of the line sensor will be described with reference to the signal waveforms shown in FIG. 2. When an integral-start pulse is applied, voltages in photodiode array 1 and photometric photodiode 2 are initialized.

When photodiode array 1 and photometric photodiode 2 are irradiated with a light, photoelectric charges are integrated in the capacitance of photometric photodiode 2, and the output of photometric photodiode 2 decreases. The change $\Delta V$ in output potential of photometric photodiode 2 is $Q_{ph}/C$ where C stands for the capacitance and $Q_{ph}$ represents the photoelectric charge integrated in the capacitance.

When the output potential of photometric photodiode 2 reaches a predetermined voltage Vref, a transfer pulse is produced. As a result, transfer gate 4 is turned on to terminate the integration, and the photoelectric charges stored in the capacitances of photodiode array 1 are transferred to CCD shift register 5 to be sequentially read out therefrom.

By changing the reference voltage Vref it is possible to change the integral time and hence the CCD output level. The reference voltage Vref may be set so that the CCD output level becomes a predetermined value. That is, in order to keep the exposure (=illuminance×integral time) constant, the reference voltage Vref is changed in accordance with illuminance.

An area sensor formed of SITs is described in a Japanese Patent application No. 61-176290 filed by the assignee of the present application. If only a part of the area sensor is driven, the area sensor can be used as a line sensor. The operation of the line sensor which is realized by picking up only one line component from the area sensor, will be described with reference to FIGS. 3A to 7.

FIG. 3A is a perspective view representing a structure of an SIT forming one pixel, and FIG. 3B is a circuit diagram of the line sensor.

As shown in FIG. 3A, on an $n^+$-type silicon substrate 11 acting as the drain of the SIT deposited is an $n^-$-type epitaxial layer 12 forming a channel region. A shallow $n^+$-type source region 13 is formed into epitaxial layer 12. Source region 13 is surrounded with a $p^+$-type gate region 14 within epitaxial layer 12. A MOS capacitor 15 is formed over gate region 14 to which a gate pulse $\phi g$ is applied through the capacitor.

When gate region 14 is reverse-biased, a depletion layer is formed on the outside of the gate region. Hole-electron pairs are produced by a light incident on the depletion layer. The electrons are drained into source region 13 and drain region 11, while holes are stored in gate region 14. Thus, the potential of the gate is raised, and a current flowing between the drain and the source is modulated with a change in the gate voltage so that a light-dependent amplified current is obtained. Reference numeral 16 denotes an isolation region adapted for isolating the SIT from other SITs.

For description of the line sensor, FIG. 3B shows one row of pixels. Pixel SITs 20-1, 20-2, ... 20-n each having the structure shown in FIG. 3A are arranged in a line to form a row 20 of pixel SITs. The SITs have their sources coupled to lines 21-1, 21-2, ... 21-n which are coupled to an output line 23 via MOS transistors 22-1, 22-2, ... 22-n acting as select switches in a readout circuit 22. Transistors 22-1, 22-2, ... 22-n have their gates coupled to a scanning circuit 24 to receive scan pulses $\phi s1, \phi s2, ... \phi sn$ therefrom.

The SITs have their gates coupled via capacitors 19-1, 19-2, ... 19-n to a line 26 which in turn is coupled to a mix circuit 27. Mix circuit 27 applies gate pulse $\phi g$ to the gate of each SIT through line 26.

A reset circuit 28 comprises MOS transistors 28-1, 28-2, ... 28-n whose gates are supplied with a reset pulse φr and drains are coupled to lines 21-1, 21-2, ... 21-n, respectively.

Mix circuit 27 sets the voltage of gate pulse φg to Vrd when a drive pulse φrd is at a "1" level, while to Vrs when φrs is at a "1" level. When pulse φg is applied to line 26, the pixels of SITs are enabled to read out stored charges, so that, when the pixels are sequentially selected by the scan pulses φs1, φs2, ... φsn, photoelectric signals are sequentially read out from the pixels.

FIG. 4 is a timing diagram of pulses for operating the line sensor, and FIG. 5 is a circuit diagram of one pixel of SIT and the associated peripheral circuit.

In FIG. 4, the pulse φg has two types of a "1" level, i.e., Vrd and Vrs. More specifically, the pulse φg has the readout level Vrd during a readout period $t_{rd}$ and the reset level Vrs during the following reset period $t_{rs}$.

The scan pulses φs1, φs2, ... φsn sequentially go to a logic "1" level during the readout time $t_{rd}$ so that the pixels of SITs arrayed in the line are sequentially scanned.

The reset pulse φrs goes to a "1" level for each of reset periods to reset the pixels of SITs from which signals have been read out.

In FIG. 5, Tp denotes an SIT, Tr a resetting MOSFET, Ts a selecting MOSFET, Cgd a parasitic capacitance across the gate and drain, Cgs a parasitic capacitance across the gate and source, Cs a stray capacitance of a source line 21, and Ron an on resistance of selecting MOS transistor Ts.

Changes with time in the gate potential Vg and source potential Vs of the pixel Tp will be described with reference to FIG. 6, which illustrates the changes with time in the gate potential Vg and source potential Vs in the pixel SIT when the pulse φs, the pulse φg and the reset pulse φr are applied to the pixel SIT. φb stands for a built-in voltage between the gate and source which will be described later.

When the pulses φg (=Vrs>φb) and φr go to a "1" level (at a time t1), the source potential Vs is reset to ground potential and Vg becomes φb (the built-in potential between the gate and source).

When the pulse φg and φr go to the ground level (at a time t2), the SIT is reverse-biased so that an integration is initiated. The gate voltage Vg (represented as Vg2 for time t2) is represented as follows:

$$Vg2 = -(Cg/(Cg+Cj)) \times Vrs + \phi b \quad (1)$$

where Cj=Cgs+Cgd.

At a time t3 in an integration period, charges Qph produced by irradiation with a light are being stored in the gate capacitance (Cg+Cj). Qph is represented as follows:

$$Qph = Gl \times A \times P \times t_{int} = Gl \times A \times E \quad (2)$$

where Gl stands for a generation rate (μA/μW), A an area (cm2) of a light-receiving surface, P an irradiance of light (μW/cm2), $t_{int}$ an integration time (seconds), and E an exposure (E=P×$t_{int}$).

By substituting equation (2) into equation (1) the gate voltage Vg3 at time t3 will be expressed as follows:

$$Vg3 = -(Cg/(Cg+Cj)) \times Vrs + \phi b + (Qph/(Cg+Cj)) \quad (3)$$

At a time t4, since φg=Vrd, the gate voltage Vg4 is represented by $$Vg4 = Vg3 + (Cg/(Cg+Cj)) \times Vrd = (Cg/(Cg+Cj)) \times (Vrd-Vrs) + \phi b + (Qph/(Cg+Cj)) \quad (4)$$

When Vg4>Vp (Vp is the gate-to-source potential difference at which the drain current of the SIT begins to flow and referred to as the pinch-off voltage), the drain current of the SIT flows so that the source line capacitance Cs is charged. This charging continues until the potential difference Vgs between the gate and source becomes Vp. Thus, the source potential Vs4 will be represented by $$Vs4 = (Cg/(Cg+Cj)) \times (Vrd-Vrs) + \phi b + (Qph/(Cg+Cj)) - Vp \quad (5)$$

Since Vp<φb, a current hardly flows from the p+-type gate to the n+-type source of the SIT.

When the pulse φs goes to a "1" level, (at a time t5), source line 21 is connected to a load resistor Rl via MOS transistor Ts (on resistance Ron). The output Vout (t) varies with time and represented as follows:

$$Vout(t) = (Rl/(Ron+Rl)) \times Vs(t) \quad (6)$$

FIG. 7 illustrates the changes of gate voltage Vg, source voltage Vs and output Vout with time when the pulse φs is at a "1" level.

When the pulse φs goes to a "1" level, the p+-type gate and n+-type source of the SIT are biased in the forward direction with the result that a current flows through the pn junction diode, and signal charges stored in the gate capacitance flow into the source. Photoelectric signal charges are destroyed, and the gate voltage Vg and the source voltage Vs both decrease. The value of output Vout represented by equation (6) becomes smaller than a value obtained by substituting equation (5) into Vs(t) of equation (6).

As described above, the circuit of FIG. 3B can operate as a line sensor.

In addition to the sensor described above, the assignee of the present application has developed various improvements in the solid-state image pickup device and claimed an area sensor in a Japanese Patent application No. 61-277346.

FIG. 8 is a circuit diagram of the area sensor used as a line sensor, and FIG. 9 is a timing diagram therefor.

In the example of FIG. 3B, the integration time differs for each of the pixels. That is, the integration time is determined by the reset pulse φrs and the scan pulse φsi (i=1~n). The reset pulse φrs is commonly used for all the pixels. But, the scan pulses φsi for respective pixels are sequentially produced. In the circuit of FIG. 8, on the other hand, the same integration time is set to all the pixels. In FIG. 8, source voltages of all the SITs are transferred to the gate capacitances of transistors 31-i through transfer transistors 30-i at the same time. In addition, in the FIG. 3B circuit, a channel current of the SIT is taken out, while, in the FIG. 8 circuit, a source potential of an SIT which has been brought to a readout state is taken out.

Transfer switches 30-1, 30-2, ... 30-n in a readout circuit 29 transfer source potentials of pixel SITs 20-1, 20-2, ... 20-n to MOS transistors 31-1, 31-2, ... 31-n through lines 21-1, 21-2, ... 21-n. MOS transistors 31-1, 31-2, ... 31-n are connected to a load resistor Rl via select switches 22-1, 22-2, ... 22-n and a line 23, thereby forming a source follower circuit.

In operation, during a reset period trs a pulse φg is set to Vrs in level, and pulses φt and φr are set to a "1"

level, thereby resetting pixel SITs. The following operations during an integration period tint are the same as those of the SIT line sensor shown in FIGS. 3A through 7.

After the lapse of an integration period $t_{int}$, when the pulse $\phi g$ is set to Vrd in level and the pulse $\phi t$ is set to a "1" level, the potentials (represented by equation (5)) on lines 21-1, 21-2, ... 21-n are transferred to MOS transistors 31-1, 31-2, ... 31-n. When pixel SITs 20-1, 20-2, ... 20-n are selected by scan pulses $\phi s1$, $\phi s2$, ... $\phi sn$, the following output Vout is taken out from output line 23.

$$Vout = A \times ((Cg/(Cg+Cj)) \times (Vrd-Vrs) + Qph/(Cg+Cj) + \phi b - Vp - Vt) \quad (7)$$

where A is a voltage gain of the source follower circuit constituted by MOS transistors 31-1, 31-2, ... 31-n, select switches 22-1, 22-2, ... 22-n and load resistor Rl, and Vt is a threshold voltage of MOS transistors 31-1, 31-2, ... 31-n.

This circuit arrangement permits a nondestructive read of the pixel SITs. If the pixel is not reset after the signal is read out from the pixel and the integration is continued to read out the signal from the pixel once more, it is necessary to change the timings of the pulses $\phi g$ and $\phi r$. In order not to reset the pixel, the pulses $\phi g$ and $\phi r$ are set to a "0" level after the read period $t_{rd}$.

Furthermore, another SIT sensor is shown in FIG. 10. In order for the SIT line sensor to have an integration-time control function, a photometric photodiode 41 is disposed adjacent to a pixel SIT 42. Reference numeral 43 denotes a readout circuit, 44 a scanning circuit, and 45 an output buffer circuit.

The above-described solid-state image pickup devices using SITs can overcome the drawbacks of the solid-state image pickup devices using MOS transistors, CCD, BBD or the like. The feature of the improved solid-state image pickup devices is that the integration time can be controlled in accordance with the amount of light by provision of a photometric photodiode adjacent to photodiode array and monitoring the potentials of the photodiode array.

However, with these devices, because the overall length of the pixel array is covered by one photometric photodiode an average measurement of light will be performed. Consequently, an accurate measurement of light cannot necessarily be obtained in some cases. For example, even if light is incident on only some of the pixels or on one pixel, the average photometric level is lower than the incident light level. Therefore, if the integration is stopped when the photometric output coincides with Vref, the output of the pixel onto which light is incident becomes larger than the predetermined level. Thus the integration time may not accurately be controlled.

SUMMARY OF THE INVENTION

It is an object of the present invention to provide a solid-state image pickup device using SITs which has a function of peak measurement of light.

A solid-state image pickup device of the present invention comprises a plurality of static induction transistors constituting pixels, arranged in a line, and integrating charges corresponding to the amount of received light; a readout circuit for reading out pixel signals representing quantities of charges integrated in the static induction transistors; a scanning circuit for controlling the readout circuit; and a photometric circuit coupled to source electrodes of the static induction transistors for controlling the integration time of the static induction transistors.

BRIEF DESCRIPTION OF THE DRAWINGS

FIG. 13 is a circuit diagram of a solid-state image pickup device according to one embodiment of the present invention.

DETAILED DESCRIPTION OF THE PREFERRED EMBODIMENT

Figure 11:
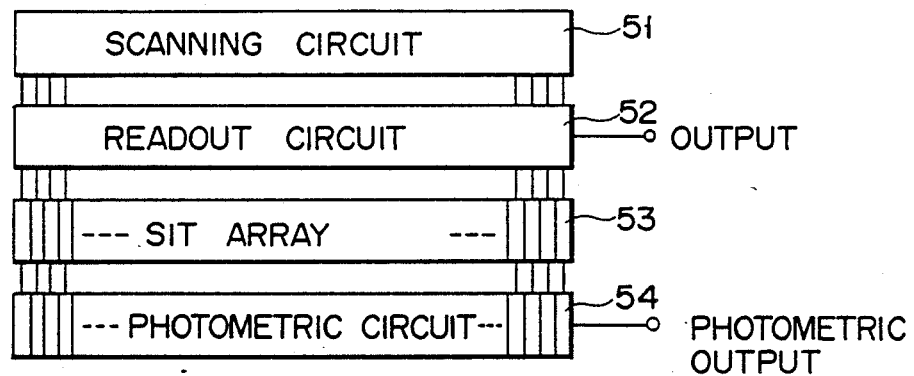
FIG. 11 is a simplified block diagram of a solid-state image pickup device according to the present invention.

Referring now to FIG. 11, a solid-state image pickup device embodying the present invention comprises a scanning circuit 51, a readout circuit 52, an SIT array 53 comprised of pixels arranged in a line, and a photometric circuit 54 comprised of photometric photo-diodes arranged in a line. In the conventional area sensors using SITs as pixels, in order to turn the pixel SITs off during an integration time for preventing generation of such false signals as blooming, smear or the like, the SITs must be used as normally-off devices.

Figure 12:
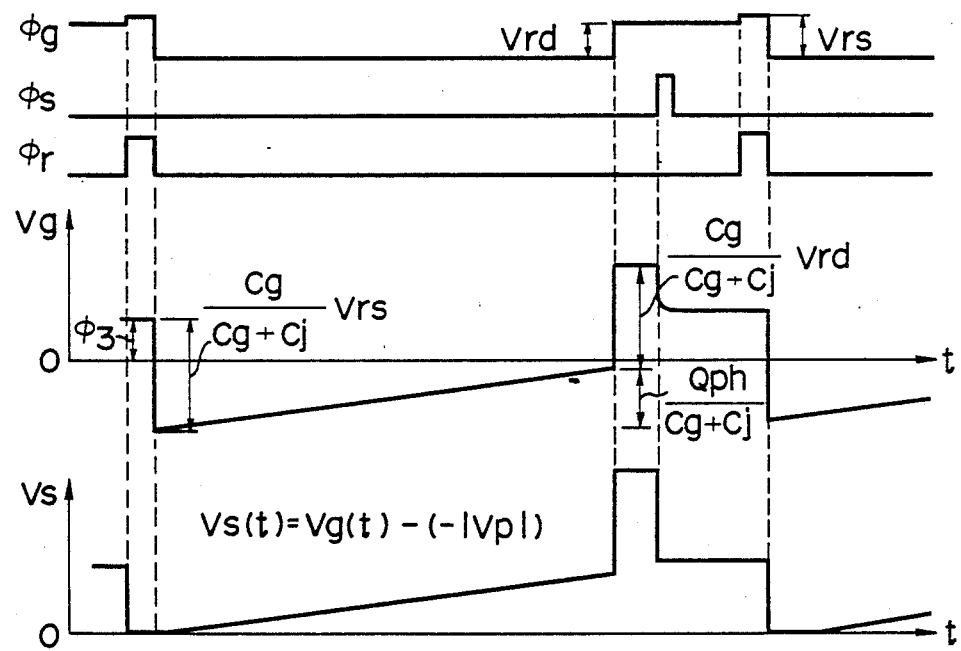
FIG. 12 is a timing diagram of the device of FIG. 11.

In the present invention, on the contrary, the SITs can be used as normally-on devices since this invention relates to the line sensor. In order to make a normally-on SIT, the inner distance Wg of the $p^+$-type gate, the depletion depth of the $p^+$-type gate, the depletion depth of the $n^+$-type source, and/or the density of the $n^-$-type epitaxial layer should be set to a suitable value. In this case, the gate potential Vg and the source potential Vs vary with time as shown in FIG. 12. Since the pinch-off voltage of SIT is negative $(-|Vp|)$, if $|Vp| > \phi b - Cj/(Cg+Cj) \times Vrs$, the SIT turns on in a gate reverse-biased state immediately following a reset operation, and $Vs(t) = Vg(t) - (-|Vp|)$.

In the signal waveform diagram of FIG. 12, the readout and reset operations are the same as those in the prior art SIT line sensors as described above except the source potential Vs. Thus, these operations may be excluded from description.

FIG. 13 is a circuit diagram of a solid-state image pickup device according to one embodiment of the invention, which is characterized by a photometric circuit to be described later in detail.

SITS 20-1, 20-2, ... 20-n constituting pixels and arranged in a line have their sources connected to lines 55-1, 55-2, ... 55-n. Pulse $\phi g$ is applied to the gates of SITS 20-1, 20-2, ... 20-n. The gates of MOS transistors 56-1, 56-2, ... 56-n constituting the photometric circuit and arranged in a line are also connected to lines 55-1, 55-2, ... 55-n.

MOS transistors 56-1, 56-2, ... 56-n have their drains connected to a power supply voltage Vdd through a common line 57 and their sources connected to a photometric output terminal Vmon through a common line along with a load resistor Rl. MOS transistors 56-1, 56-2, ... 56-n and load resistor Rl form a source follower circuit.

With the pinch-off voltage Vp of the SITs in pixel SIT array 20 and the reset voltage Vrs, the gate voltage Vg2 is represented, as in equation (1), as follows:

$$Vg2 = -(Cg/(Cg+Cj)) \times Vrs + \phi b \qquad (8)$$

The source voltage Vs2 at this time is given by
$$Vs2 = Vg2 - (-|Vp|) = -(Cg/(Cg+Cj)) \times Vrs + \phi b + |Vp| \qquad (9)$$

The output Vmon at this time is represented as follows:

$$Vmon = A \times (Vs2 - Vt) = A \times (-(Cg/(Cg+Cj)) \times Vrs + \phi b + |Vp| - Vt) \qquad (10)$$

where Vt is a threshold voltage of MOS transistors 56-1, 56-2, ... 56-n, and A is a voltage gain of the source follower circuit formed of the MOS transistors and load resistor Rl. The values of parameters are set such that Vmon > 0.

For example, when $(Cg/(Cg+Cj)) \times VrS = 0.5 \times 3 = 1.5$, $\phi b = 0.7$, and $Vt = 0.5$, $|Vp| = 1.5 - 0.7 + 0.5 = 1.3$. This means that SITs having a pinch-off voltage of $-1.3$ volts are used.

Figure 1:
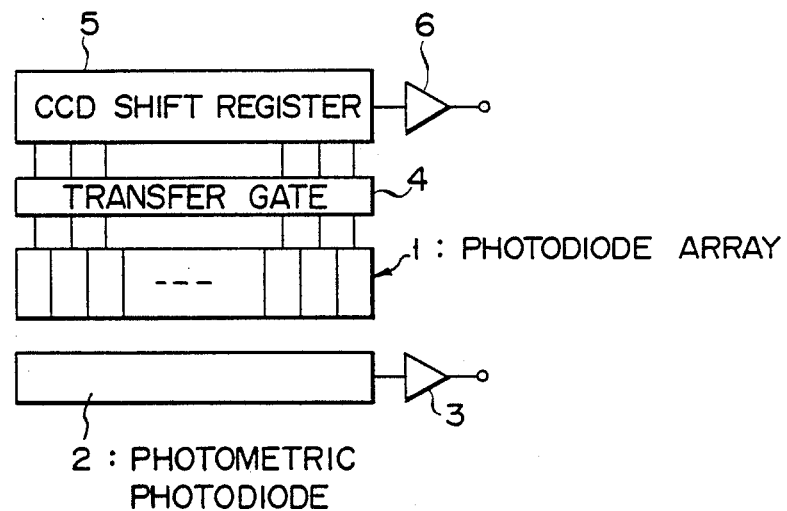
FIG. 1 is a block diagram of a prior art solid-state image pickup device.
Figure 2:
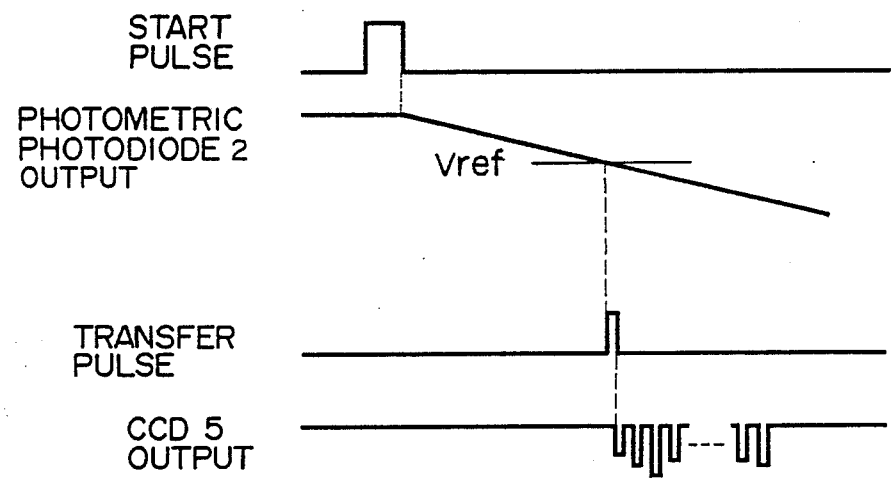
FIG. 2 is a timing diagram used for explaining the operation of the device of FIG. 1.
Figure 3A:
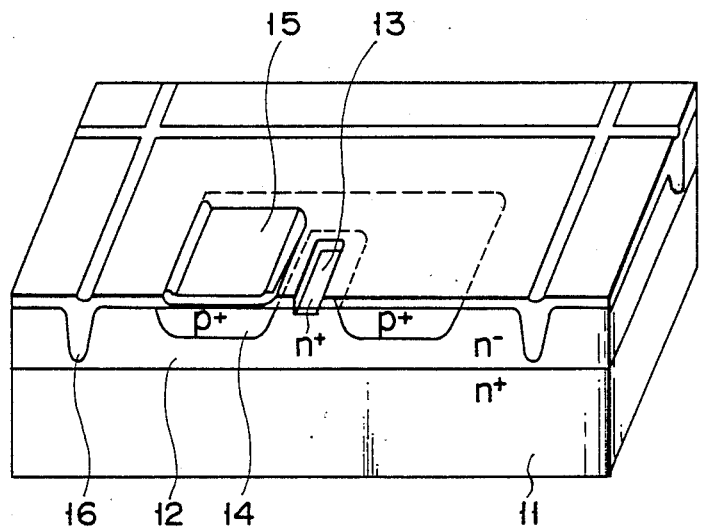
FIGS. 3A and 3B shows another prior art solid-state image pickup device.
Figure 3B:
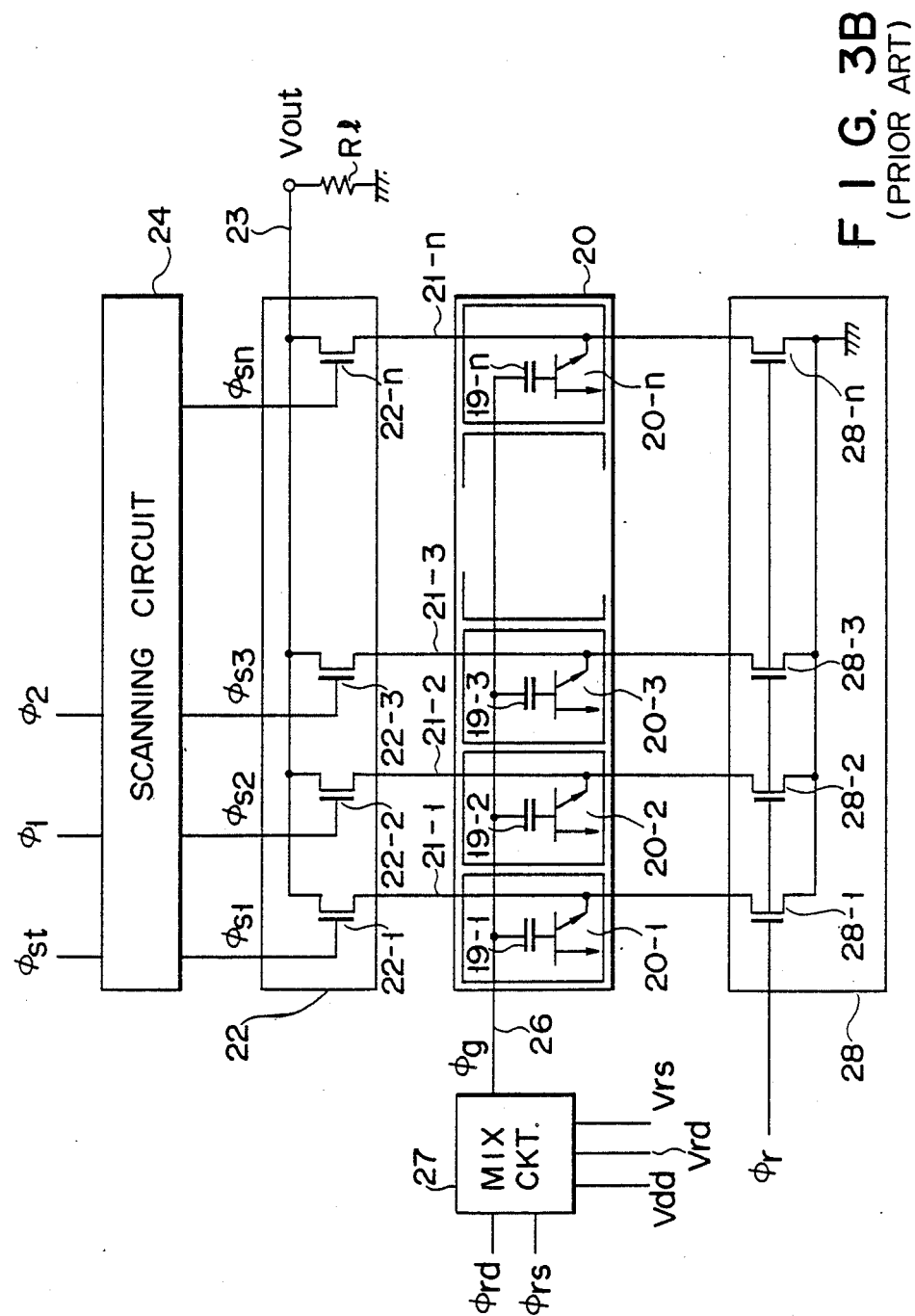
Figure 4:
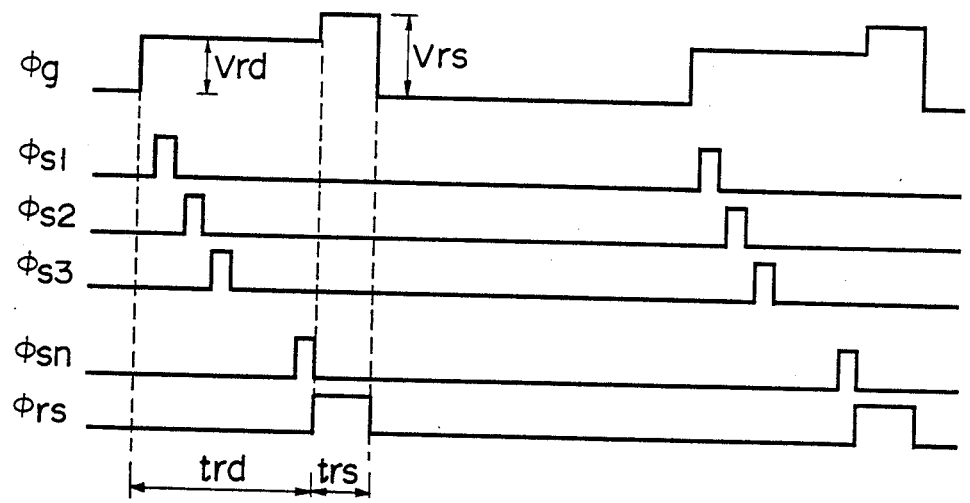
FIG. 4 is a timing diagram used for explaining the operation of the device of FIG. 3B.
Figure 5:
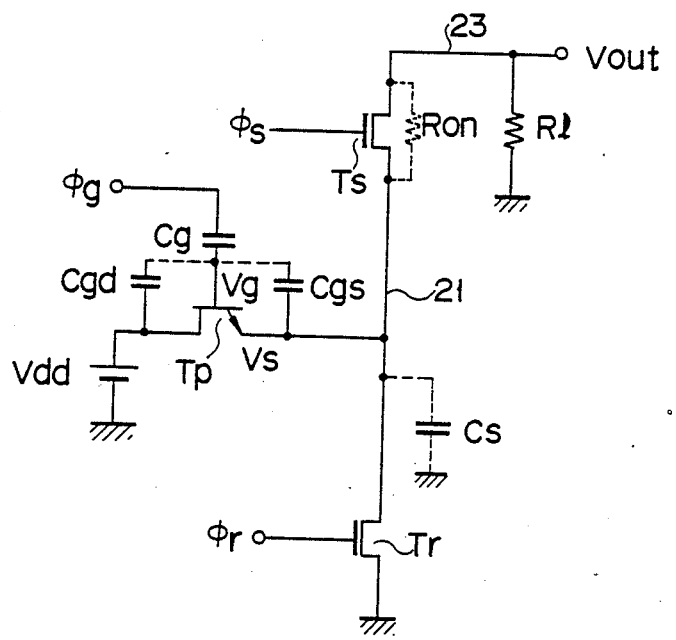
FIG. 5 is a circuit diagram associated with one pixel of the solid-state image pickup device of FIG. 3B.
Figure 6:
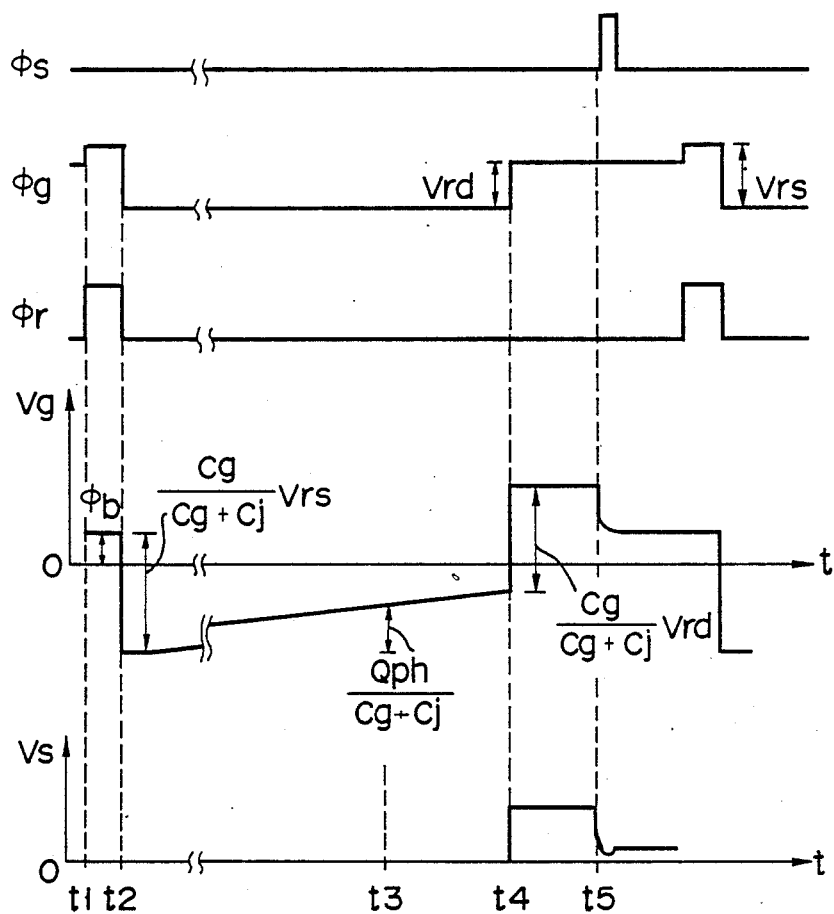
FIG. 6 is a timing diagram illustrating the operation of the circuit of FIG. 5.
Figure 7:
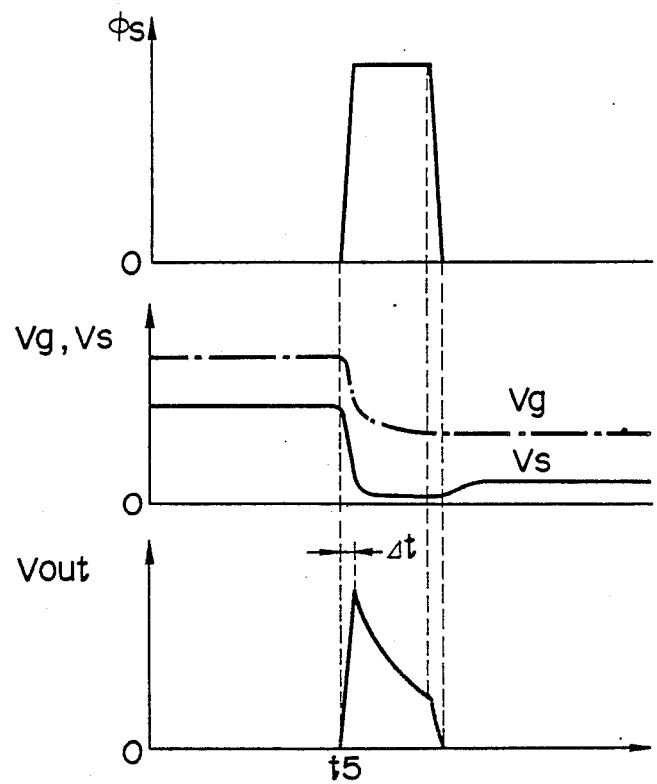
FIG. 7 shows changes in potentials in the FIG. 5 circuit.
Figure 8:
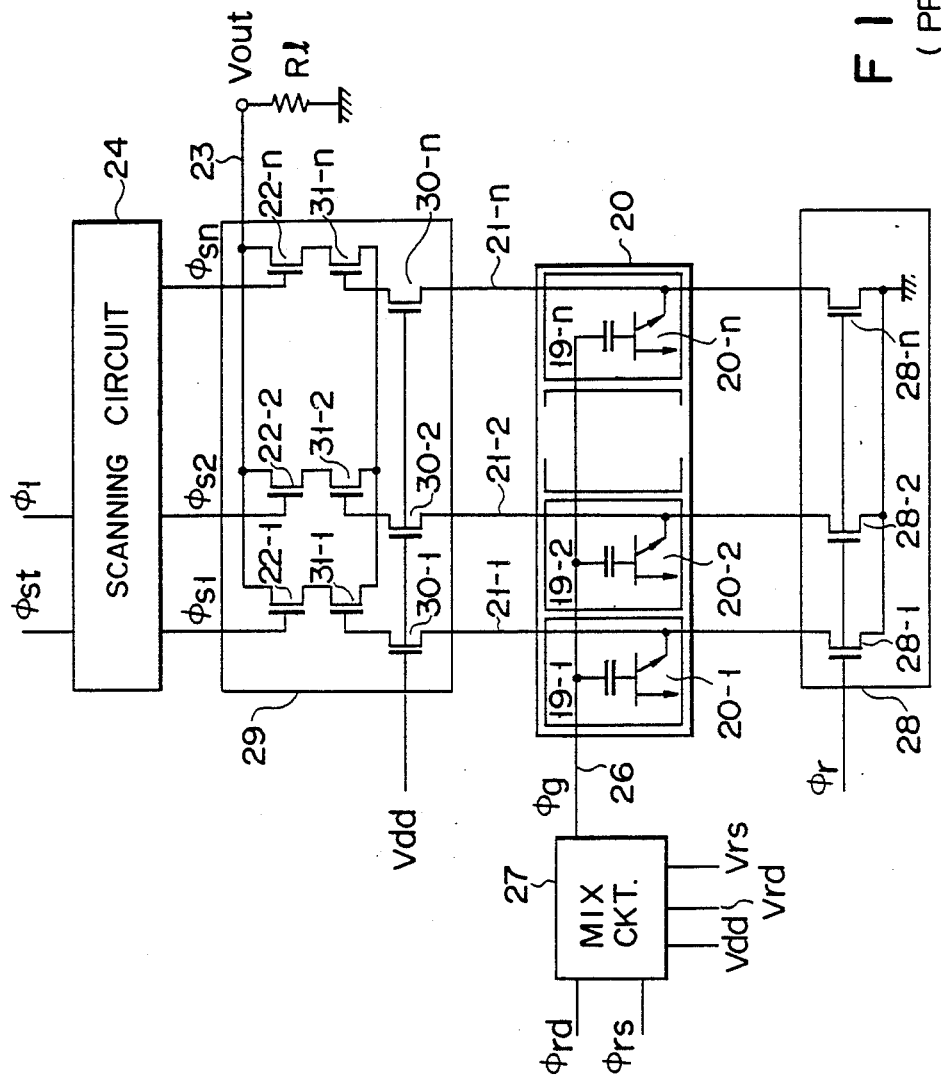
FIG. 8 illustrates still another prior art solid-state image pickup device.
Figure 9:
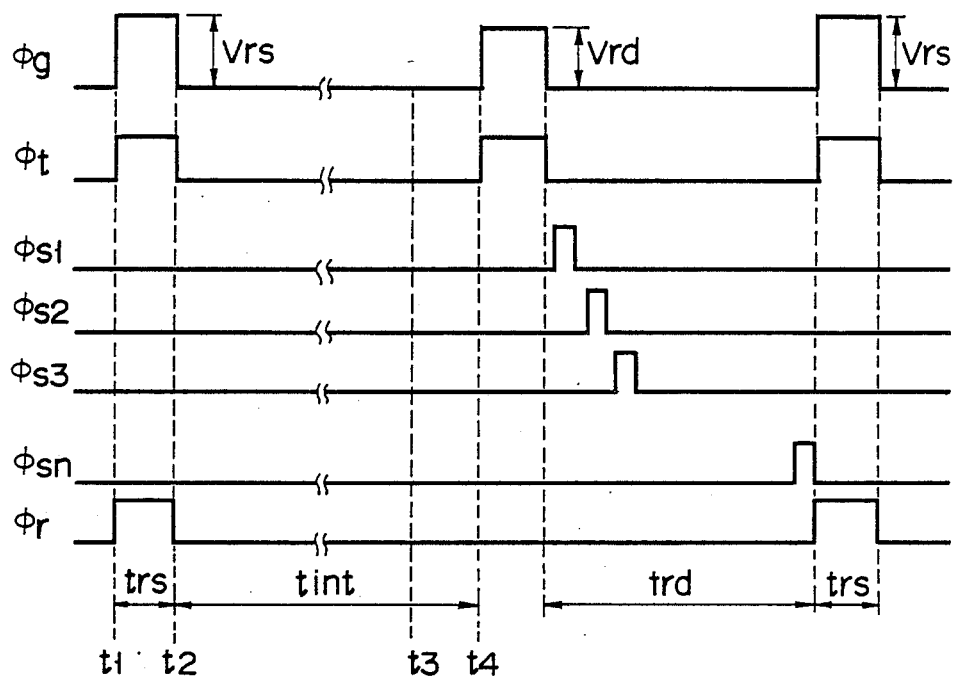
FIG. 9 is a timing diagram of the device of FIG. 8.
Figure 10:
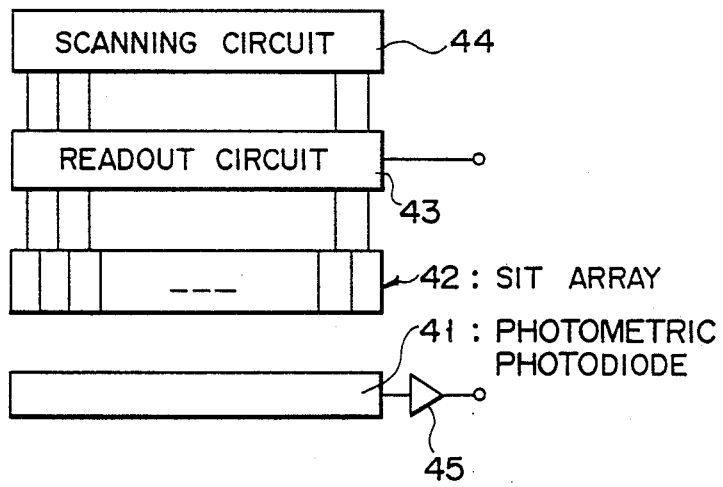
FIG. 10 shows a further prior art solid-state image pickup device.

The actual integration time control is the same as that in the case of FIG. 2. Namely, when the output Vmon reaches the reference voltage Vref, the integration is terminated to take out signals from the pixels. In this case, the photometric output Vmon is greatly influenced by the source potential of a pixel SIT exposed to the strongest light in SIT array 20. That is, the photometric circuit 54 is arranged to provide a peak output.

According to the present invention, as described above, an SIT forming a pixel is used as a normally-on device, and the state of the SIT is monitored during an integration period. Consequently, a solid-state image pickup device can be implemented which is capable of accurate measurement of light and accurate control of integration time.

What is claimed is:
1. A solid-state image pickup device comprising:
   a plurality of static induction transistors for constituting pixels, arranged in a line, and integrating charges corresponding to amounts of received light;
   readout means for reading out a pixel signal representing the amount of charges integrated in each of said static induction transistors;
   scanning means for controlling said readout means; and
   photometric means coupled to sources of said static induction transistors for controlling integral time of said static induction transistors;
   said photometric means comprising:
      a plurality of MOS transistors having their gates connected, respectively, to the sources of said static induction transistors and their drains being commonly connected to a positive power source; and
      a load resistor connected to sources of said MOS transistors.

* * * * *